United States Patent
Yao et al.

(10) Patent No.: US 9,922,827 B2
(45) Date of Patent: Mar. 20, 2018

(54) METHOD OF FORMING A SEMICONDUCTOR STRUCTURE

(71) Applicant: TAIWAN SEMICONDUCTOR MANUFACTURING COMPANY, LTD., Hsinchu (TW)

(72) Inventors: Liang-Gi Yao, Shin Chu (TW); Chia-Cheng Chen, Hsinchu (TW); Ta-Ming Kuan, Zhongli (TW); Jeff J. Xu, Jhubei (TW); Clement Hsingjen Wann, Carmel, NY (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 17 days.

(21) Appl. No.: 14/713,211

(22) Filed: May 15, 2015

(65) Prior Publication Data

US 2015/0249011 A1 Sep. 3, 2015

Related U.S. Application Data

(60) Division of application No. 13/242,090, filed on Sep. 23, 2011, now Pat. No. 9,040,393, which is a
(Continued)

(51) Int. Cl.
*H01L 21/20* (2006.01)
*H01L 21/02* (2006.01)
(Continued)

(52) U.S. Cl.
CPC .. *H01L 21/02661* (2013.01); *H01L 21/26506* (2013.01); *H01L 21/2822* (2013.01);
(Continued)

(58) Field of Classification Search
CPC ......... H01L 21/26506; H01L 21/28088; H01L 21/28194; H01L 21/2822; H01L 21/02661;
(Continued)

(56) References Cited

U.S. PATENT DOCUMENTS 5,581,202 A 12/1996 Yano et al.
5,767,732 A 6/1998 Lee et al.
(Continued)

FOREIGN PATENT DOCUMENTS

CN 101179046 5/2005
CN 1945829 4/2007
(Continued)

OTHER PUBLICATIONS

Shikida, Mitsuhiro et al., "Comparison of Anisotropic Etching Properties Between KOH and TMAH Solutions", Depto. of Micro System Engineering, Nagoya University, Chikusa, Nagoya, 464-8603, Japan, IEEE Jun. 30, 2010, pp. 315-320.
(Continued)

*Primary Examiner* — Trung Q Dang
(74) *Attorney, Agent, or Firm* — Hauptman Ham, LLP

(57) ABSTRACT

A method of cleaning a semiconductor structure includes rotating a semiconductor structure. The method of cleaning further includes cleaning the semiconductor structure with a hydrogen fluoride (HF)-containing gas. A method of forming a semiconductor device includes forming a recess in a source/drain (S/D) region of a transistor. The method of forming further includes cleaning the recess with a HF-containing gas, the HF-containing gas having an oxide removing rate of about 2 nanometer/minute (nm/min) or less. The method of forming further includes epitaxially
(Continued)

forming a strain structure in the recess after the cleaning the recess, the strain structure providing a strain to a channel region of the transistor.

20 Claims, 14 Drawing Sheets

Related U.S. Application Data continuation-in-part of application No. 12/687,574, filed on Jan. 14, 2010, now Pat. No. 8,106,469.

(60) Provisional application No. 61/405,858, filed on Oct. 22, 2010.

(51) Int. Cl.
| | |
|---|---|
| H01L 21/265 | (2006.01) |
| H01L 29/49 | (2006.01) |
| H01L 29/51 | (2006.01) |
| H01L 21/8234 | (2006.01) |
| H01L 21/28 | (2006.01) |
| H01L 29/66 | (2006.01) |
| H01L 29/78 | (2006.01) |

(52) U.S. Cl.
CPC .. *H01L 21/823418* (2013.01); *H01L 29/4966* (2013.01); *H01L 29/517* (2013.01); *H01L 29/7848* (2013.01); H01L 21/28088 (2013.01); H01L 21/28194 (2013.01); H01L 29/6659 (2013.01); H01L 29/7833 (2013.01)

(58) Field of Classification Search
CPC ........... H01L 21/823418; H01L 29/517; H01L 29/7848
USPC .................................................. 438/706, 478
See application file for complete search history.

(56) References Cited

U.S. PATENT DOCUMENTS

| | | | |
|---|---|---|---|
| 5,954,911 A * | 9/1999 | Bergman | ............ C23C 16/4481 |
| | | | 118/715 |
| 5,963,789 A | 10/1999 | Tsuchiaki | |
| 6,121,786 A | 9/2000 | Yamagami et al. | |
| 6,503,794 B1 | 1/2003 | Watanabe et al. | |
| 6,613,634 B2 | 9/2003 | Ootsuka et al. | |
| 6,622,738 B2 | 9/2003 | Scovell | |
| 6,642,090 B1 | 11/2003 | Fried et al. | |
| 6,706,571 B1 | 3/2004 | Yu et al. | |
| 6,713,365 B2 | 3/2004 | Lin et al. | |
| 6,727,557 B2 | 4/2004 | Takao | |
| 6,743,673 B2 | 6/2004 | Watanabe et al. | |
| 6,762,448 B1 | 7/2004 | Lin et al. | |
| 6,791,155 B1 | 9/2004 | Lo et al. | |
| 6,828,646 B2 | 12/2004 | Marty et al. | |
| 6,830,994 B2 | 12/2004 | Mitsuki et al. | |
| 6,858,478 B2 | 2/2005 | Chau et al. | |
| 6,872,647 B1 | 3/2005 | Yu et al. | |
| 6,940,747 B1 | 9/2005 | Sharma et al. | |
| 6,949,768 B1 | 9/2005 | Anderson et al. | |
| 6,964,832 B2 | 11/2005 | Moniwa et al. | |
| 7,009,273 B2 | 3/2006 | Inoh et al. | |
| 7,018,901 B1 | 3/2006 | Thean et al. | |
| 7,026,232 B1 | 4/2006 | Koontz et al. | |
| 7,067,400 B2 | 6/2006 | Bedell et al. | |
| 7,078,312 B1 | 7/2006 | Sutanto et al. | |
| 7,084,079 B2 | 8/2006 | Conti et al. | |
| 7,084,506 B2 | 8/2006 | Takao | |
| 7,112,495 B2 | 9/2006 | Ko et al. | |
| 7,153,744 B2 | 12/2006 | Chen et al. | |
| 7,157,351 B2 | 1/2007 | Cheng et al. | |
| 7,190,050 B2 | 3/2007 | King et al. | |
| 7,193,399 B2 | 3/2007 | Aikawa | |
| 7,247,887 B2 | 7/2007 | King et al. | |
| 7,265,008 B2 | 9/2007 | King et al. | |
| 7,265,418 B2 | 9/2007 | Yun et al. | |
| 7,297,600 B2 | 11/2007 | Oh et al. | |
| 7,300,837 B2 | 11/2007 | Chen et al. | |
| 7,323,375 B2 | 1/2008 | Yoon et al. | |
| 7,351,622 B2 | 4/2008 | Buh et al. | |
| 7,358,166 B2 | 4/2008 | Agnello et al. | |
| 7,361,563 B2 | 4/2008 | Shin et al. | |
| 7,374,986 B2 | 5/2008 | Kim et al. | |
| 7,394,116 B2 | 7/2008 | Kim et al. | |
| 7,396,710 B2 | 7/2008 | Okuno | |
| 7,407,847 B2 | 8/2008 | Doyle et al. | |
| 7,410,844 B2 | 8/2008 | Li et al. | |
| 7,425,740 B2 | 9/2008 | Liu et al. | |
| 7,442,967 B2 | 10/2008 | Ko et al. | |
| 7,456,087 B2 | 11/2008 | Cheng | |
| 7,494,862 B2 | 2/2009 | Doyle et al. | |
| 7,508,031 B2 | 3/2009 | Liu et al. | |
| 7,528,465 B2 | 5/2009 | King et al. | |
| 7,534,689 B2 | 5/2009 | Pal et al. | |
| 7,538,387 B2 | 5/2009 | Tsai | |
| 7,550,332 B2 | 6/2009 | Yang | |
| 7,598,145 B2 | 10/2009 | Damlencourt et al. | |
| 7,605,449 B2 | 10/2009 | Liu et al. | |
| 7,682,911 B2 | 3/2010 | Jang et al. | |
| 7,759,228 B2 | 7/2010 | Sugiyama et al. | |
| 7,795,097 B2 | 9/2010 | Pas | |
| 7,798,332 B1 | 9/2010 | Brunet | |
| 7,820,513 B2 | 10/2010 | Hareland et al. | |
| 7,851,865 B2 | 12/2010 | Anderson et al. | |
| 7,868,317 B2 | 1/2011 | Yu et al. | |
| 7,898,041 B2 | 3/2011 | Radosavljevic et al. | |
| 7,923,321 B2 | 4/2011 | Lai et al. | |
| 7,923,339 B2 | 4/2011 | Meunier-Beillard et al. | |
| 7,960,791 B2 | 6/2011 | Anderson et al. | |
| 7,985,633 B2 | 7/2011 | Cai et al. | |
| 7,989,846 B2 | 8/2011 | Furuta | |
| 7,989,855 B2 | 8/2011 | Narihiro | |
| 8,003,466 B2 | 8/2011 | Shi et al. | |
| 8,043,920 B2 | 10/2011 | Chan et al. | |
| 8,076,189 B2 | 12/2011 | Grant | |
| 8,101,475 B2 | 1/2012 | Oh et al. | |
| 2002/0025684 A1* | 2/2002 | Butterbaugh | ........ C23C 16/0236 |
| | | | 438/712 |
| 2002/0170598 A1* | 11/2002 | Girard | ............... C03B 37/01413 |
| | | | 137/240 |
| 2003/0080361 A1 | 5/2003 | Murthy et al. | |
| 2003/0109086 A1 | 6/2003 | Arao | |
| 2003/0234422 A1 | 12/2003 | Wang et al. | |
| 2004/0075121 A1 | 4/2004 | Yu et al. | |
| 2004/0129998 A1 | 7/2004 | Inoh et al. | |
| 2004/0132253 A1* | 7/2004 | Hori | ................ H01L 21/823462 |
| | | | 438/275 |
| 2004/0192067 A1 | 9/2004 | Ghyselen et al. | |
| 2004/0219722 A1 | 11/2004 | Pham et al. | |
| 2004/0259315 A1 | 12/2004 | Sakaguchi et al. | |
| 2005/0020020 A1 | 1/2005 | Collaert et al. | |
| 2005/0051865 A1 | 3/2005 | Lee et al. | |
| 2005/0082616 A1 | 4/2005 | Chen et al. | |
| 2005/0153490 A1 | 7/2005 | Yoon et al. | |
| 2005/0170593 A1 | 8/2005 | Kang et al. | |
| 2005/0176252 A1* | 8/2005 | Goodman | ............... B24B 37/08 |
| | | | 438/692 |
| 2005/0212080 A1 | 9/2005 | Wu et al. | |
| 2005/0221591 A1 | 10/2005 | Bedell et al. | |
| 2005/0224800 A1 | 10/2005 | Lindert et al. | |
| 2005/0233598 A1 | 10/2005 | Jung et al. | |
| 2005/0266698 A1 | 12/2005 | Cooney et al. | |
| 2005/0280102 A1 | 12/2005 | Oh et al. | |
| 2006/0038230 A1 | 2/2006 | Ueno et al. | |
| 2006/0068553 A1 | 3/2006 | Thean et al. | |
| 2006/0091481 A1 | 5/2006 | Li et al. | |
| 2006/0091482 A1 | 5/2006 | Kim et al. | |
| 2006/0091937 A1 | 5/2006 | Do | |
| 2006/0105557 A1 | 5/2006 | Klee et al. | |
| 2006/0128071 A1 | 6/2006 | Rankin et al. | |
| 2006/0138572 A1 | 6/2006 | Arikado et al. | |

(56) References Cited

U.S. PATENT DOCUMENTS

| | | |
|---|---|---|
| 2006/0151808 A1 | 7/2006 | Chen et al. |
| 2006/0153995 A1 | 7/2006 | Narwankar et al. |
| 2006/0166475 A1 | 7/2006 | Mantl |
| 2006/0196527 A1* | 9/2006 | Nishimura .............. G03F 7/423 134/2 |
| 2006/0214212 A1 | 9/2006 | Horita et al. |
| 2006/0258156 A1 | 11/2006 | Kittl |
| 2007/0001173 A1 | 1/2007 | Brask et al. |
| 2007/0004218 A1 | 1/2007 | Lee et al. |
| 2007/0015334 A1 | 1/2007 | Kittl et al. |
| 2007/0020827 A1 | 1/2007 | Buh et al. |
| 2007/0024349 A1 | 2/2007 | Tsukude |
| 2007/0029576 A1 | 2/2007 | Nowak et al. |
| 2007/0048907 A1 | 3/2007 | Lee et al. |
| 2007/0072353 A1* | 3/2007 | Wu .................. H01L 29/66636 438/197 |
| 2007/0076477 A1 | 4/2007 | Hwang et al. |
| 2007/0093010 A1 | 4/2007 | Mathew et al. |
| 2007/0093036 A1 | 4/2007 | Cheng et al. |
| 2007/0096148 A1 | 5/2007 | Hoentschel et al. |
| 2007/0120156 A1 | 5/2007 | Liu et al. |
| 2007/0122953 A1 | 5/2007 | Liu et al. |
| 2007/0122954 A1 | 5/2007 | Liu et al. |
| 2007/0128782 A1 | 6/2007 | Liu et al. |
| 2007/0132053 A1 | 6/2007 | King et al. |
| 2007/0145487 A1 | 6/2007 | Kavalieros et al. |
| 2007/0152276 A1 | 7/2007 | Arnold et al. |
| 2007/0166929 A1 | 7/2007 | Matsumoto et al. |
| 2007/0178637 A1 | 8/2007 | Jung et al. |
| 2007/0221956 A1 | 9/2007 | Inaba |
| 2007/0236278 A1 | 10/2007 | Hur et al. |
| 2007/0241414 A1 | 10/2007 | Narihiro |
| 2007/0247906 A1 | 10/2007 | Watanabe et al. |
| 2007/0254440 A1 | 11/2007 | Daval |
| 2008/0001171 A1 | 1/2008 | Tezuka et al. |
| 2008/0036001 A1 | 2/2008 | Yun et al. |
| 2008/0042209 A1 | 2/2008 | Tan et al. |
| 2008/0050882 A1 | 2/2008 | Bevan et al. |
| 2008/0085580 A1 | 4/2008 | Doyle et al. |
| 2008/0085590 A1 | 4/2008 | Yao et al. |
| 2008/0095954 A1 | 4/2008 | Gabelnick et al. |
| 2008/0102586 A1 | 5/2008 | Park |
| 2008/0124878 A1 | 5/2008 | Cook et al. |
| 2008/0227241 A1 | 9/2008 | Nakabayashi et al. |
| 2008/0265344 A1 | 10/2008 | Mehrad et al. |
| 2008/0290470 A1 | 11/2008 | King et al. |
| 2008/0296632 A1 | 12/2008 | Moroz et al. |
| 2008/0318392 A1 | 12/2008 | Hung et al. |
| 2009/0020884 A1* | 1/2009 | Lee .................... H01L 21/3105 257/774 |
| 2009/0026540 A1 | 1/2009 | Sasaki et al. |
| 2009/0039388 A1 | 2/2009 | Teo et al. |
| 2009/0066763 A1 | 3/2009 | Fujii et al. |
| 2009/0155969 A1 | 6/2009 | Chakravarti et al. |
| 2009/0166625 A1 | 7/2009 | Ting et al. |
| 2009/0181477 A1 | 7/2009 | King et al. |
| 2009/0200612 A1 | 8/2009 | Koldiaev |
| 2009/0239347 A1 | 9/2009 | Ting et al. |
| 2009/0321836 A1 | 12/2009 | Wei et al. |
| 2010/0032715 A1* | 2/2010 | Cheng ............ H01L 21/823807 257/190 |
| 2010/0055870 A1 | 3/2010 | Katou |
| 2010/0155790 A1 | 6/2010 | Lin et al. |
| 2010/0163926 A1 | 7/2010 | Hudait et al. |
| 2010/0187613 A1 | 7/2010 | Colombo et al. |
| 2010/0207211 A1 | 8/2010 | Sasaki et al. |
| 2010/0308379 A1 | 12/2010 | Kuan et al. |
| 2010/0320416 A1 | 12/2010 | Savu et al. |
| 2011/0018065 A1 | 1/2011 | Curatola et al. |
| 2011/0108920 A1 | 5/2011 | Basker et al. |
| 2011/0129990 A1 | 6/2011 | Mandrekar et al. |
| 2011/0195555 A1 | 8/2011 | Tsai et al. |
| 2011/0195570 A1 | 8/2011 | Lin et al. |
| 2011/0256682 A1 | 10/2011 | Yu et al. |
| 2011/0308603 A1 | 12/2011 | Vermang et al. |
| 2012/0086053 A1 | 4/2012 | Tseng et al. |
| 2012/0208302 A1 | 8/2012 | Itoh et al. |
| 2012/0208375 A1 | 8/2012 | Ohmi et al. |

FOREIGN PATENT DOCUMENTS

| | | |
|---|---|---|
| CN | 1011459116 | 6/2009 |
| JP | 2007-194336 | 8/2007 |
| KR | 10-2005-0119424 | 12/2005 |
| KR | 1020070064231 | 6/2007 |
| TW | 497253 | 8/2002 |
| WO | WO2007/115585 | 10/2007 |

OTHER PUBLICATIONS

Lenoble, Damien, "Plasma Doping as an Alternative Route for Ultra Shallow Junction Integration to Standard CMOS Technologies", STMicroelectronics, Crolles Cedex, France, Semiconductor Fabtech, 16th Edition, pp. 1-5.

Chui, King-Jien et al., "Source/Drain Germanium Condensation for P-Channel Strained Ultra-Thin Body Transistors", Silicon Nano Device Lab, Dept. of Electrical and Computer Engineering, National University of Singapore, IEEE 2005.

Quirk et al., Semiconductor Manufacturing Technology, Oct. 2001, Prentice Hall, Chapter 16.

McVittie, James P., et al., "Speedie: A Profile Simulator for Etching and Deposition", Proc. SPIE 1392, 126 (1991).

90 nm Technology. retrieved from the internet <URL:http://tsmc.com/english/dedicatedFoundry/technology/90nm.htm.

Merriam Webster definition of substantially retrieved from the internet <URL:http://www.merriann-webster.com/dictionary/substantial>.

Smith, Casey Eben, Advanced Technology for Source Drain Resistance, Diss. University of North Texas, 2008.

Liow, Tsung-Yang et al., "Strained N-Channel FinFETs Featuring in Situ Doped Silicon-Carbon Si1-YCy Source Drain Stressors with High Carbon Content", IEEE Transactions on Electron Devices 55.9 (2008): 2475-483.

Office Action dated Mar. 28, 2012 from corresponding application No. CN 201010228334.6.

Notice of Decision on Patent dated Mar. 12, 2012 from corresponding application No. 10-2010-0072103.

OA dated Mar. 27, 2012 from corresponding application No. KR10-2010-0094454.

OA dated Mar. 29, 2012 from corresponding application No. KR10-2010-0090264.

Office Action dated May 2, 2012 from corresponding application No. CN 201010196345.0.

Office Action dated May 4, 2012 from corresponding application No. CN 201010243667.6.

Anathan, Had, et al., "FinFet SRAM—Device and Circuit Design Considerations", Quality Electronic Design, 2004, Proceedings 5th International Symposium (2004); pp. 511-516.

Jha, Niraj, Low-Power FinFET Circuit Design, Dept. of Electrical Engineering, Princeton University n.d.

Kedzierski, J., et al., "Extension and Source/Drain Design for High-Performance FinFET Devices", IEEE Transactions on Electron Devices, vol. 50, No. 4, Apr. 2003, pp. 952-958.

Liow, Tsung-Yang et al., "Strained N-Channel FinFETs with 25 nm Gate Length and Silicon-Carbon Source/Drain Regions for Performance Enhancement", VLSI Technology, 2006, Digest of Technical Papers, 2006 Symposium on VLSI Technology 2006; pp. 56-57.

\* cited by examiner

METHOD OF FORMING A SEMICONDUCTOR STRUCTURE

PRIORITY CLAIM

The present application is a divisional of U.S. application Ser. No. 13/242,090, filed Sep. 23, 2011, which claims priority of U.S. Application No. 61/405,858, filed Oct. 22, 2010. U.S. application Ser. No. 13/242,090 is a Continuation-in-part of U.S. application Ser. No. 12/687,574, filed Jan. 14, 2010, which are hereby incorporated by reference in their entireties.

RELATED APPLICATIONS

The present application is related to U.S. patent application Ser. No. 12/707,788, filed on Feb. 18, 2010, titled MEMORY POWER GATING CIRCUIT AND METHODS; Ser. No. 12/758,426, filed on Apr. 12, 2010, titled FINFETS AND METHODS FOR FORMING THE SAME; Ser. No. 12/731,325, filed on Mar. 25, 2010, titled ELECTRICAL FUSE AND RELATED APPLICATIONS; Ser. No. 12/724,556, filed on Mar. 16, 2010, titled ELECTRICAL ANTI-FUSE AND RELATED APPLICATIONS; Ser. No. 12/757,203, filed on Apr. 9, 2010, titled STI STRUCTURE AND METHOD OF FORMING BOTTOM VOID IN SAME; Ser. No. 12/797,839, filed on Jun. 10, 2010, titled FIN STRUCTURE FOR HIGH MOBILITY MULTIPLE-GATE TRANSISTOR; Ser. No. 12/831,842, filed on Jul. 7, 2010, titled METHOD FOR FORMING HIGH GERMANIUM CONCENTRATION SiGe STRESSOR; Ser. No. 12/761,686, filed on Apr. 16, 2010, titled FINFETS AND METHODS FOR FORMING THE SAME; Ser. No. 12/766,233, filed on Apr. 23, 2010, titled FIN FIELD EFFECT TRANSISTOR; Ser. No. 12/757,271, filed on Apr. 9, 2010, titled ACCUMULATION TYPE FINFET, CIRCUITS AND FABRICATION METHOD THEREOF; Ser. No. 12/694,846, filed on Jan. 27, 2010, titled INTEGRATED CIRCUITS AND METHODS FOR FORMING THE SAME; Ser. No. 12/638,958, filed on Dec. 14, 2009, titled METHOD OF CONTROLLING GATE THICKNESS IN FORMING FINFET DEVICES; Ser. No. 12/768,884, filed on Apr. 28, 2010, titled METHODS FOR DOPING FIN FIELD-EFFECT TRANSISTORS; Ser. No. 12/731,411, filed on Mar. 25, 2010, titled INTEGRATED CIRCUIT INCLUDING FINFETS AND METHODS FOR FORMING THE SAME; Ser. No. 12/775,006, filed on May 6, 2010, titled METHOD FOR FABRICATING A STRAINED STRUCTURE; Ser. No. 12/886,713, filed Sep. 21, 2010, titled METHOD OF FORMING INTEGRATED CIRCUITS; Ser. No. 12/941,509, filed Nov. 8, 2010, titled MECHANISMS FOR FORMING ULTRA SHALLOW JUNCTION; Ser. No. 12/900,626, filed Oct. 8, 2010, titled TRANSISTOR HAVING NOTCHED FIN STRUCTURE AND METHOD OF MAKING THE SAME; Ser. No. 12/903,712, filed Oct. 13, 2010, titled FINFET AND METHOD OF FABRICATING THE SAME; 61/412,846, filed Nov. 12, 2010, 61/394,418, filed Oct. 19, 2010, titled METHODS OF FORMING GATE DIELECTRIC MATERIAL and 61/405,858, filed Oct. 22, 2010, titled METHODS OF FORMING SEMICONDUCTOR DEVICES; which are incorporated herein by reference in their entireties.

The present application is also related to U.S. application Ser. No. 12/789,681, entitled "Scaling EOT by Eliminating Interfacial Layers from High-K/Metal Gates of MOS Devices" filed on May 28, 2010, U.S. application Ser. No. 12/892,254, entitled "METHODS OF FORMING INTEGRATED CIRCUITS" filed on Sep. 28, 2010, and U.S. Provisional Application Ser. No. 61/394,418, entitled "METHODS OF FORMING GATE DIELECTRIC MATERIAL" filed on Oct. 19, 2010, which are incorporated herein by reference.

TECHNICAL FIELD

The present disclosure relates generally to the field of semiconductor devices.

BACKGROUND

The semiconductor integrated circuit (IC) industry has experienced rapid growth. Technological advances in IC materials and design have produced generations of ICs where each generation has smaller and more complex circuits than the previous generation. In the course of integrated circuit evolution, functional density (i.e., the number of interconnected devices per chip area) has generally increased while geometry size (i.e., the smallest component (or line) that can be created using a fabrication process) has decreased. However, these advances have increased the complexity of processing and manufacturing ICs. For example, the reliability and functional challenges of ultra-thin gate oxides are becoming increasingly greater for increasingly small IC devices. Hence, reduction in interface defect density ($D_{it}$) at the substrate/oxide interface to increase carrier mobility and reduce current leakage, and reduction in capacitive effective thickness ($C_{ef}$) to increase scale, in current IC fabrication processes is highly desirable.

Therefore, while existing methods of fabricating semiconductor devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
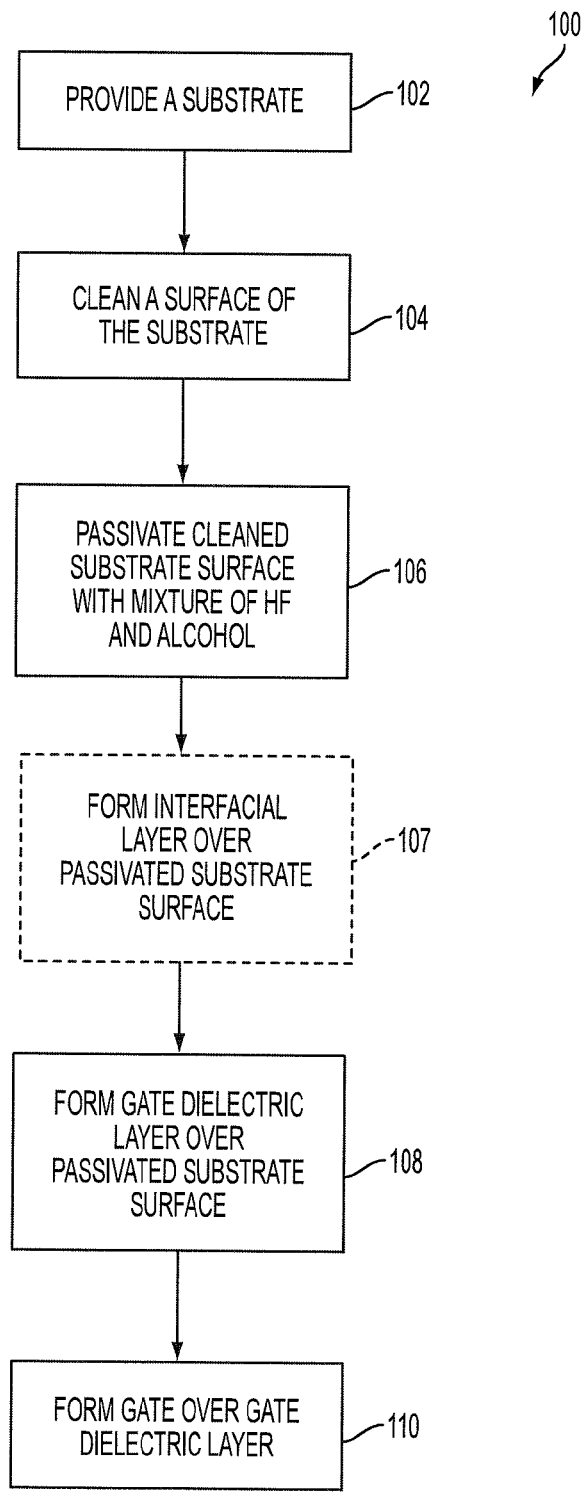
FIG. 1 is a flowchart illustrating a method of fabricating a semiconductor device according to various aspects of the present disclosure.

During the scaling trend, various materials have been implemented for the gate electrode and gate dielectric for complementary metal-oxide-semiconductor (CMOS) devices. CMOS devices have typically been formed with a gate oxide and polysilicon gate electrode. There has been a desire to replace the gate oxide and polysilicon gate electrode with a high dielectric constant (high-k) gate dielectric and metal gate electrode to improve device performance as feature sizes continue to decrease.

It is understood that the following disclosure provides many different embodiments, or examples, for implementing different features of various embodiments. Specific examples of components and arrangements are described below to further clarify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Illustrated in FIG. 1 is a flowchart of an example method 100 for fabricating a semiconductor device. FIGS. 2A-2J are diagrammatic fragmentary cross-sectional views of the semiconductor device during various fabrication stages. Illustrated in FIG. 3 is an example system 300 for fluorine-passivating a substrate of the semiconductor device. The semiconductor device may include an integrated circuit (IC) chip, system on chip (SoC), or portion thereof, that may include various passive and active microelectronic devices, such as resistors, capacitors, inductors, diodes, metal-oxide-semiconductor field effect transistors (MOSFET), CMOS transistors, bipolar junction transistors (BJT), laterally diffused MOS (LDMOS) transistors, high power MOS transistors, FinFET transistors, or other types of transistors. It is understood that FIGS. 2A-2J have been simplified for a better understanding of the embodiments of the present disclosure. Accordingly, it should be noted that additional processes may be provided before, during, and after the method 100 of FIG. 1, and that some other processes may only be briefly described herein.

Referring now to FIG. 1, the method 100 begins with block 102 in which a substrate is provided, for example in a spray chamber (312 in FIG. 3). The method 100 continues with block 104 in which a surface of the substrate is cleaned to remove particulates and/or contaminants, which may include organic and/or metallic materials. The cleaned surface of the substrate is then passivated by a mixture including fluorine and an alcohol, at block 106, to form a fluorine-passivated surface on the substrate. A gate dielectric layer is formed over the fluorine-passivated surface, as shown in block 108. An interfacial layer, for example a thin oxide, is optionally formed between the fluorine-passivated surface and the gate dielectric layer, as shown in block 107. A metal gate electrode is then formed over the gate dielectric layer, as shown in block 110.

Referring now to FIGS. 2A-2J in conjunction with FIG. 1, a semiconductor device 200 is fabricated in accordance with the method 100 of FIG. 1. The semiconductor device 200 has a substrate 201. The substrate 201 is a silicon substrate doped with a P-type dopant, such as boron (a P-type substrate). In some alternative embodiments, the substrate 201 could be another suitable semiconductor material. For example, the substrate 201 may be a silicon substrate that is doped with an N-type dopant, such as phosphorous or arsenic (an N-type substrate). In yet some other embodiments, the substrate 201 may alternatively be made of some other suitable elementary semiconductor, such as diamond or germanium; a suitable compound semiconductor, such as silicon carbide, silicon germanium, indium arsenide, or indium phosphide; or a suitable alloy semiconductor, such as silicon germanium carbide, gallium arsenic phosphide, or gallium indium phosphide. Further, the substrate 201 could include an epitaxial layer (epi layer), may be strained for performance enhancement, and may include a silicon-on-insulator (SOI) structure.

Shallow trench isolation (STI) features 202a, 202b may also be formed in the substrate 201. The STI features 202a, 202b are formed by etching recesses (or trenches) in the substrate 201 and filling the recesses with a dielectric material. In at least one embodiment, the dielectric material of the STI features 202a, 202b includes silicon oxide. In some alternative embodiments, the dielectric material of the STI features 202a, 202b may include silicon nitride, silicon oxy-nitride, fluoride-doped silicate (FSG), and/or a low-k dielectric material.

Figure 2A:
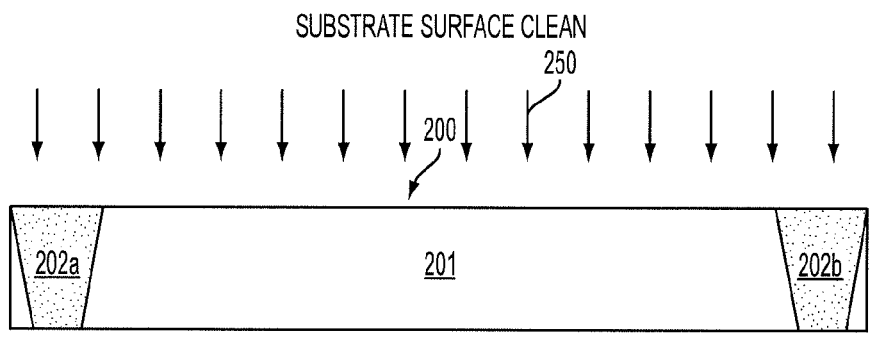
FIGS. 2A to 2J illustrate cross-sectional views of the semiconductor device at various stages of fabrication according to the method of FIG. 1.
Figure 3:
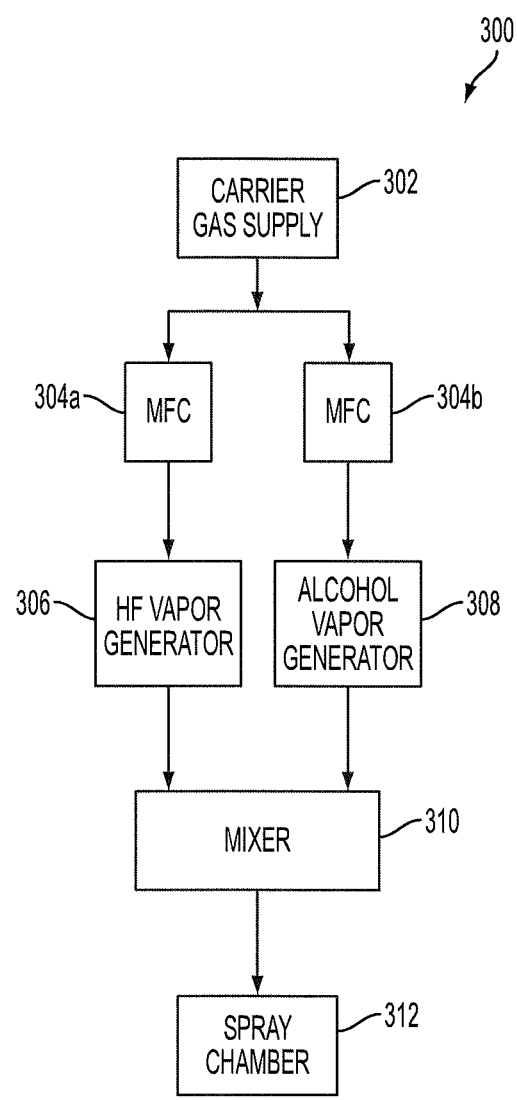
FIG. 3 is a block diagram illustrating a system for fluorine passivating a semiconductor substrate surface according to various aspects of the present disclosure.

Referring to FIG. 2A, a top surface of substrate 201 undergoes a surface cleaning process 250 (as shown by downward arrows) to remove particulates and/or contaminants, which may include organic and/or metallic materials. The cleaning process may include a variety of applicable chemicals and techniques, and in one example may include the use of hydrofluoric acid, ammonium hydroxide, hydrogen peroxide, hydrochloric acid, sulfuric acid, and/or ozone. In one example, the chemicals may be utilized in a wet dip or liquid, vapor and/or heated environment to clean the substrate surface. In yet another example, standard RCA, sulfuric-peroxide mixture (SPM), standard clean 1 (SC1), and/or standard clean 2 (SC2) chemicals and processes may be used to clean the substrate surface.

Figure 2B:
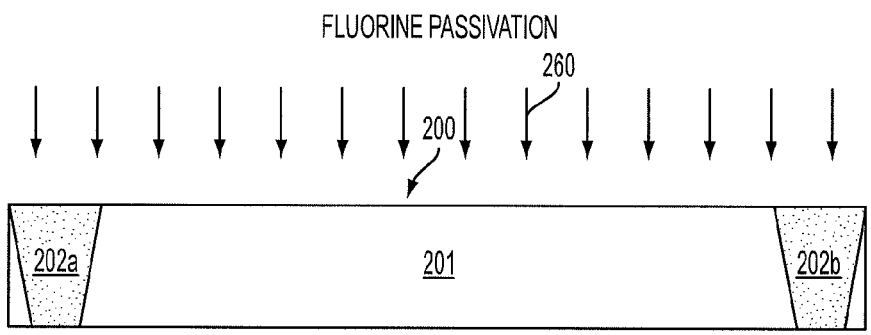
Figure 2C:
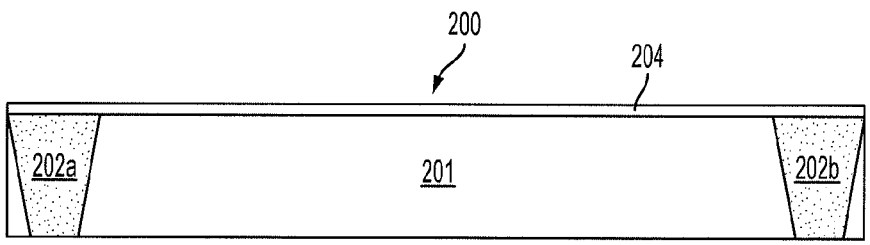

Thereafter, as shown in FIG. 2B, the cleaned surface of the substrate 201 undergoes a fluorine passivation process 260 (as shown by downward arrows) to form a fluorine-passivated surface 204 over the bulk substrate 201 and the STI features 202a, 202b, as shown in FIG. 2C.

In the present embodiment, substrate 201 is passivated by a mixture including fluorine and alcohol, such as isopropyl alcohol (IPA), methanol, or ammonia. In an example, the mixture may include a hydrous hydrofluoric acid vapor and an IPA vapor supplied by a carrier gas such as nitrogen. In another example, the passivation mixture includes about 10 percent of weight-percentage (wt %) to about 80 wt % of hydrous hydrofluoric acid vapor, for example including hydrofluoric acid at about 49 wt %. In another example, the passivation mixture includes hydrofluoric acid vapor and IPA vapor at a weight ratio of around 0.5/1 to 10/1, for example around 3/1. In yet another example, the mixture may include hydrofluoric acid and alcohol in a different form, such as a liquid or aqueous form of HF and IPA. In yet another example, the mixture may include hydrofluoric acid and ammonia ($NH_3$). Other carrier gases which are essentially non-reactive with silicon, such as argon, may be suitable. In another embodiment, fluorine-passivated surface 204 includes carbon, oxygen, fluorine, and silicon atoms, and the fluorine passivation process is tuned to form the fluorine-passivated surface 204 to include fluorine at an atomic concentration greater than 2% and/or to minimize the atomic concentration of carbon and oxygen residue at the fluorine-passivated surface. The amount of hydrofluoric acid and alcohol provided in the passivation mixture may be used to tune the fluorine passivation process.

In some embodiments, fluorine passivation process 260 is performed at a temperature ranging from ambient temperature to about 100 degrees Celsius and under a pressure ranging from atmospheric pressure to about 300 torr in one embodiment, and does not require high temperature implantation, annealing, UV light, or plasma processing, thereby avoiding interface defects that may occur from those processes. In at least another embodiment, fluorine passivation 260 may be performed at a temperature ranging from ambient temperature about 100 degrees Celsius and under a pressure ranging from 1 milli-torr (mtorr) to about 10 torr, and then with a baking process from about 50 to about 200 degrees.

Figure 2D:
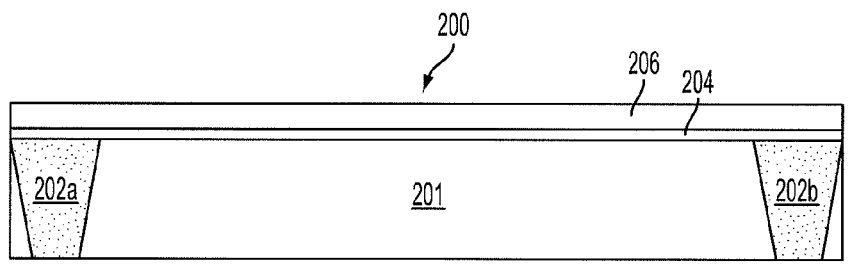

Thereafter, an interfacial layer 206 is optionally formed over the fluorine-passivated surface 204, as shown in FIG. 2D. In one example, the interfacial layer 206 is formed by an atomic layer deposition (ALD) process and includes silicon oxide ($SiO_2$). In another example, the interfacial layer 206 is grown in an oxygen environment below 1000 degrees Celsius, and in another example below 850 degrees Celsius. The interfacial layer 206 has a thickness less than about 1 nanometers (nm), and in one embodiment, may be in a range from approximately 0.3 nm to approximately 1 nm.

Figure 2E:
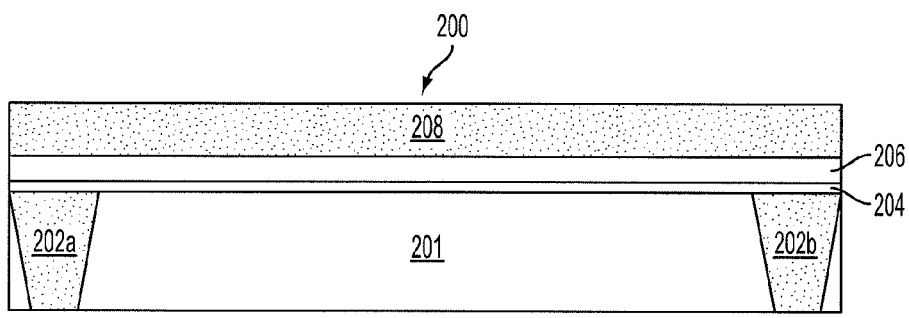

A dielectric layer 208 is then formed over the interfacial layer 206, as shown in FIG. 2E. However, as noted above, interfacial layer 206 is optional and the dielectric layer 208 may be formed over the fluorine-passivated surface 204 without an intervening interfacial layer. In one example, the dielectric layer 208 is formed by an ALD process and includes a high-k dielectric material. A high-k dielectric material is a material having a dielectric constant that is greater than a dielectric constant of $SiO_2$, which is approximately 4. In an embodiment, the dielectric layer 208 includes hafnium oxide ($HfO_2$), which has a dielectric constant that is in a range from approximately 18 to approximately 40. The dielectric layer 208 has a thickness that is greater than the interfacial layer 206, and in one embodiment, may be in a range from about 1 nanometer to about 3 nanometers. In some alternative embodiments, the dielectric layer 208 may include one or more of AlO, HfO, ZrO, $ZrO_2$, ZrSiO, YO, $Y_2O_3$, LaO, $La_2O_5$, GdO, $Gd_2O_5$, TiO, $TiO_2$, TiSiO, TaO, $Ta_2O_5$, TaSiO, HfErO, HfLaO, HfYO, HfGdO, HfAlO, HfZrO, HfTiO, HfTaO, HfSiO, SrTiO, ZrSiON, HfZrTiO, HfZrSiON, HfZrLaO, HfZrAlO, or other applicable dielectric materials.

Figure 2F:
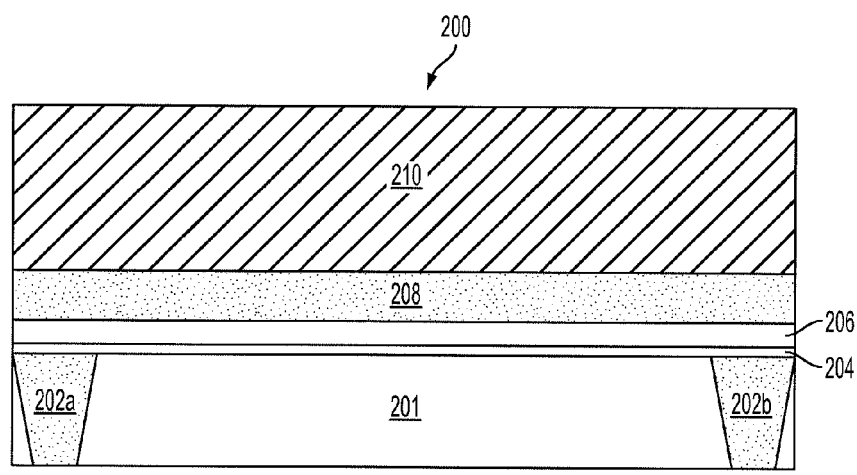

Referring now to FIG. 2F, a gate electrode layer 210 is formed over the gate dielectric layer 208. The gate electrode layer 210 may include a metallic material, such as TiN, TaN, TaC, TaSiN, WN, TiAl, tungsten (W), aluminum (Al), copper (Cu), or combinations thereof; or a polysilicon material for a dummy gate or a polysilicon gate electrode. The metal gate electrode layer 210 may be formed by chemical vapor deposition (CVD), physical vapor deposition (PVD), or another suitable technique. The metal layer is a small portion of the gate electrode layer 210 in a gate first process flow.

Figure 2G:
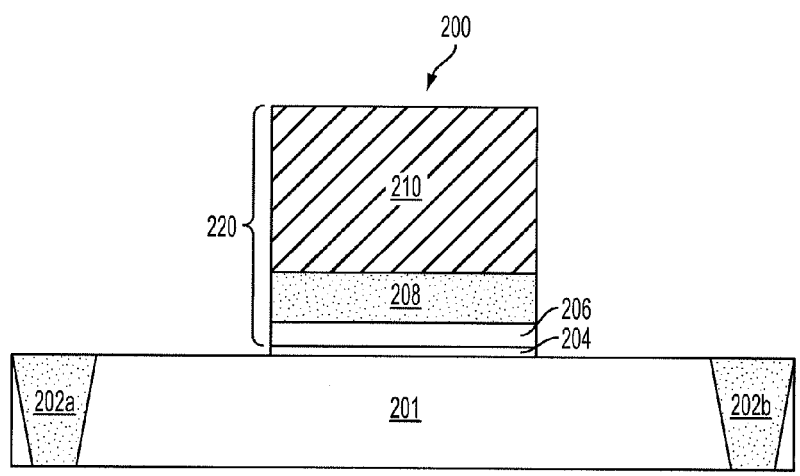

Referring to FIG. 2G, the fluorine-passivated surface 204, the interfacial layer 206, the gate dielectric layer 208, and the gate electrode layer 210 are patterned using a photolithography process to form a gate structure 220 (also referred to as a gate stack) of the semiconductor device 200. A portion of the fluorine-passivated surface 204 that is over the STI structures 202a, 202b is also removed during this step, with the fluorine-passivated surface advantageously reducing loss of dielectric material from the STI structures during an etching or patterning process. In another embodiment, the gate stack with fluorined-passivated surface is formed in gate-last process flow (replacement gate flow).

Figure 2H:
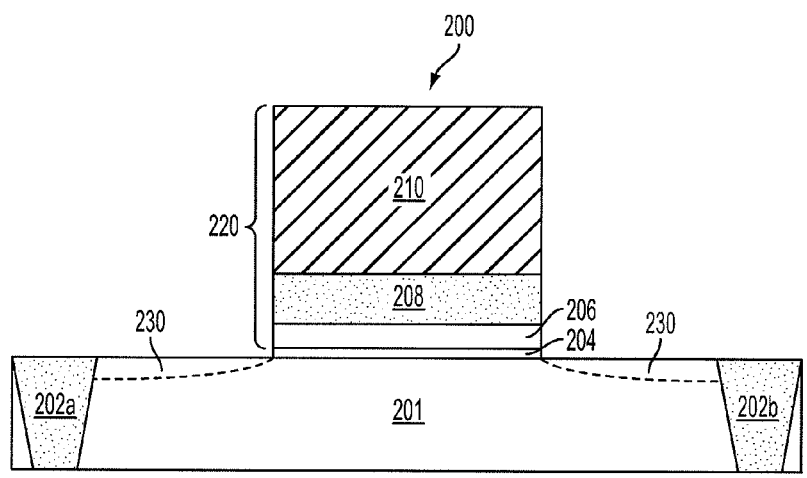

Referring to FIG. 2H, after the gate structure 220 is formed, lightly doped source/drain (also referred to as LDD) regions 230 may be formed in portions of the substrate 201 on either side of the gate structure 220. The LDD regions may be formed by an ion implantation process or a diffusion process. N-type dopants, such as phosphorus or arsenic, may be used to form the semiconductor device 200 as an NMOS device, and P-type dopants, such as boron, may be used to form the semiconductor device 200 as a PMOS device.

Figure 2I:
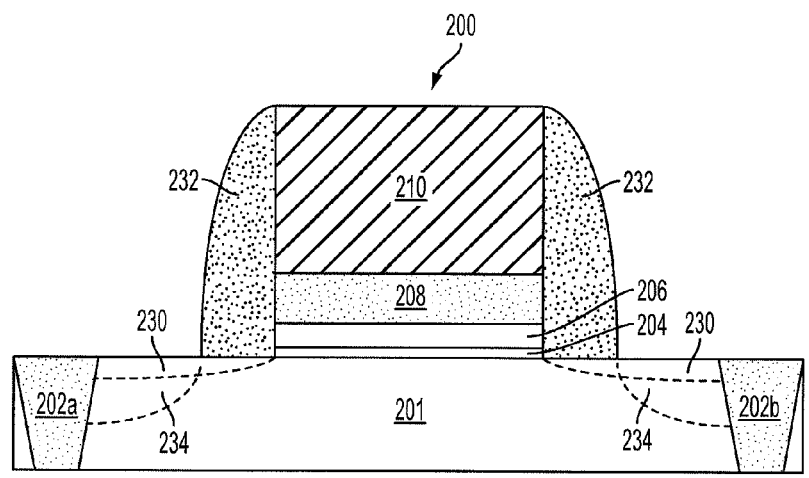

Gate spacers 232 may then be formed over the substrate and on either side of the gate structure 220 using a deposition process and an etching process (for example, an anisotropic etching process), as shown in FIG. 2I. The gate spacers 232 include a suitable dielectric material, such as silicon nitride, silicon oxide, silicon carbide, silicon oxynitride, or combinations thereof. Thereafter, heavily doped source and drain regions 234 (also referred to as active regions) are formed in portions of the substrate on either side of the structure of combined gate structure 220 and gate spacers 232. The active regions 234 may be formed by an ion implantation process or a diffusion process. N-type dopants, such as phosphorus or arsenic, may be used to form the semiconductor device 200 as an NMOS device, and P-type dopants, such as boron, may be used to form the semiconductor device 200 as a PMOS device. The active regions 234 are aligned with the gate spacers 232.

Figure 2J:
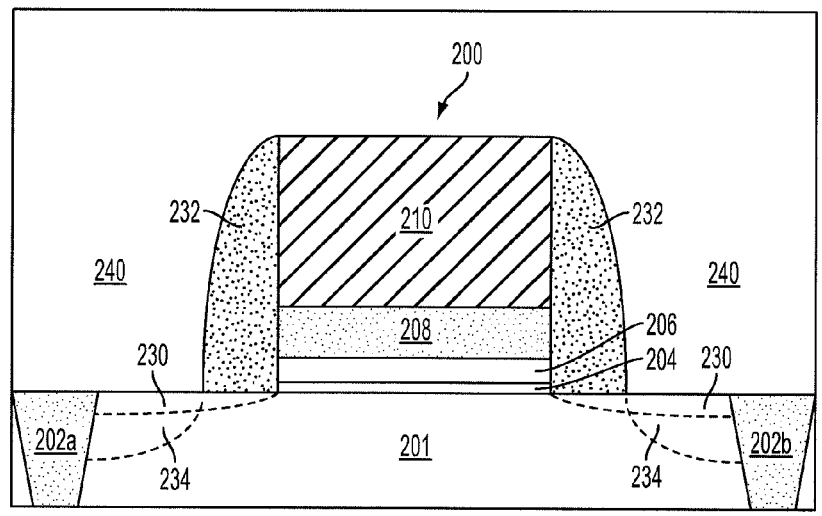

An inter-layer (or inter-level) dielectric (ILD) layer 240 is then formed over the substrate and the gate structure, as shown in FIG. 2J. The ILD layer 240 may be formed by chemical vapor deposition (CVD), high density plasma CVD, spin-on, sputtering, or other suitable methods. In at least one embodiment, the ILD layer 240 includes silicon oxide. In some alternative embodiments, the ILD layer 240 could include silicon oxy-nitride, silicon nitride, or a low-k material.

Although not illustrated, one or more annealing processes are performed on the semiconductor device to activate the active regions. These annealing processes may have relatively high temperatures (such as temperatures greater than approximately 700 degrees Celsius) and may be performed before or after a CMP process on the ILD layer 240. Advantageously, the gate dielectric layer is capable of withstanding high annealing temperatures without crystallizing, thus reducing potential gate leakage current.

Thus, FIGS. 2A-2J illustrate the various stages of a "gate first" process. Additional processes may be performed to complete the fabrication of the semiconductor device 200, such as the forming of an interconnect structure and other backend structures known in the art. For the sake of simplicity, these processes are not illustrated herein.

In another process flow, gate stack could be formed on fluorine passivated surface after removing dummy gate electrode in replacement process flow.

As described above, it is understood that the gate electrode layer 210 may either be used in a "gate first" process, or the gate electrode layer 210 may also be used as a dummy gate electrode in a "gate last" process. For example, if gate electrode 210 of FIGS. 2F-2J was formed of a polysilicon material, a chemical-mechanical-polishing (CMP) process could be performed on the ILD layer 240 of FIG. 2J to expose a top surface of the gate structure 220. Following the CMP process, the top surface of the gate structure 220 is substantially co-planar with the top surface of the ILD layer 240 on either side of the gate structure 220. Although not illustrated, one or more annealing processes are performed on the semiconductor device to activate the active regions 234. These annealing processes may have relatively high temperatures (such as temperatures greater than approximately 700 degrees Celsius) and may be performed before or after the CMP process. As discussed above, the gate dielectric layer 208 is capable of withstanding such high annealing temperatures without crystallizing, thus reducing potential gate leakage current. Afterwards, the gate electrode 210 is removed, thereby forming a trench in place of the gate electrode 210. The gate electrode 210 may be removed in a wet etching or a dry etching process, while the rest of the layers of the semiconductor device remain substantially un-etched. Since the polysilicon gate electrode 210 is removed in the gate last process, it is also referred to as a "dummy gate." Finally, a metal layer is formed within the trench and over the gate dielectric layer 208.

It is understood that additional processes may be performed to complete the fabrication of the semiconductor device 200. For example, these additional processes may include deposition of passivation layers, formation of contacts, and formation of interconnect structures (e.g., lines and vias, metal layers, and interlayer dielectric that provide electrical interconnection to the device including the formed metal gate). For the sake of simplicity, these additional processes are not described herein.

The fluorine-passivated surface 204 of substrate 201 offers many advantages, and it is understood that different embodiments may offer different advantages, and that no particular advantage is necessarily required for all embodiments. One of the advantages offered by the fluorine-passivation process of the present disclosure is to have lower interface defect density ($D_{it}$), which allows for enhanced insulation and function of the gate oxide to increase carrier mobility, and increase device reliability. As noted above, high temperature implantation/doping and annealing processes are avoided thereby decreasing $D_{it}$, maintaining dielectric constants of the gate oxide layers, and also reducing thermal budget for the device fabrication. A further advantage of the fluorine-passivation process of the present disclosure is reduced current effective thickness ($C_{et}$) of the gate oxide layers to improve scale in IC device fabrication. As noted above, the optional interfacial layer 206 is less than 1 nm, and in the present embodiment, in a range of between about 0.3 nm and 1 nm, and the dielectric layer 208 is between about 1 nm and 3 nm. It has been further observed that fluorine-passivation of the substrate surface also allows for effective atomic layer deposition of a gate oxide layer (e.g., a high-k oxide) at the fluorine-passivated surface.

Accordingly, the present disclosure achieves a reduced gate leakage current. Also, the overall thickness of gate oxide layers 206 and 208 are reduced without doping that would lower the dielectric constant values of gate oxide layers 206 and 208. Hence, the present disclosure offers desired advantages of lower leakage current without sacrificing either the overall thickness or the dielectric constant of the gate oxide.

Referring now to FIG. 3, a system 300 for fluorine-passivating a substrate of the semiconductor device includes, in at least one embodiment, a carrier gas supply 302, two mass flow controllers 304a, 304b operably coupled to the carrier gas supply 302, a HF vapor generator 306 operably coupled to MFC 304a, an alcohol vapor generator 308 operably coupled to MFC 304b, a mixer 310 operably coupled to Hydrogen Fluoride (HF) vapor generator 306 and alcohol vapor generator 308, and a spray chamber 312 operably coupled to mixer 310. Controlled amounts of carrier gas, such as nitrogen, from carrier gas supply 302, is supplied to HF vapor generator 306 and alcohol vapor generator 308 by MFCs 304a and 304b, respectively, to supply controlled amounts of the HF vapor and the alcohol vapor into mixer 310. Mixer 310 then provides the fluorine-passivation mixture of HF vapor and alcohol vapor to the spray chamber 312, where the mixture is used to passivate the substrate surface of the semiconductor device at room temperature and atmospheric pressure. MFCs 304a, 304b may be used to tune the fluorine-passivation process to provide a desired concentration of fluorine at the passivated surface and/or to minimize concentrations of carbon and oxygen at the passivated surface.

In one example, the flowrate of HF vapor was between about 500 and about 10000 milli-liter (ml) in carrier gas of per liter of nitrogen per minute and the flowrate of IPA vapor was between about 1000 and about 10000 ml in carrier gas of per liter of nitrogen per minute provided to mixer 310. The substrate surface was then processed by the passivation mixture for between 10 and 200 seconds at room temperature and atmospheric pressure in spray chamber 312. In another example, about 6 ml of HF vapor per liter of nitrogen per minute and about 2 ml of IPA vapor per liter of nitrogen per minute were provided to mixer 310. The substrate surface was then processed by the passivation mixture for a process time range from 10 to 200 seconds at room temperature and atmospheric pressure in spray chamber 312.

Figure 4:
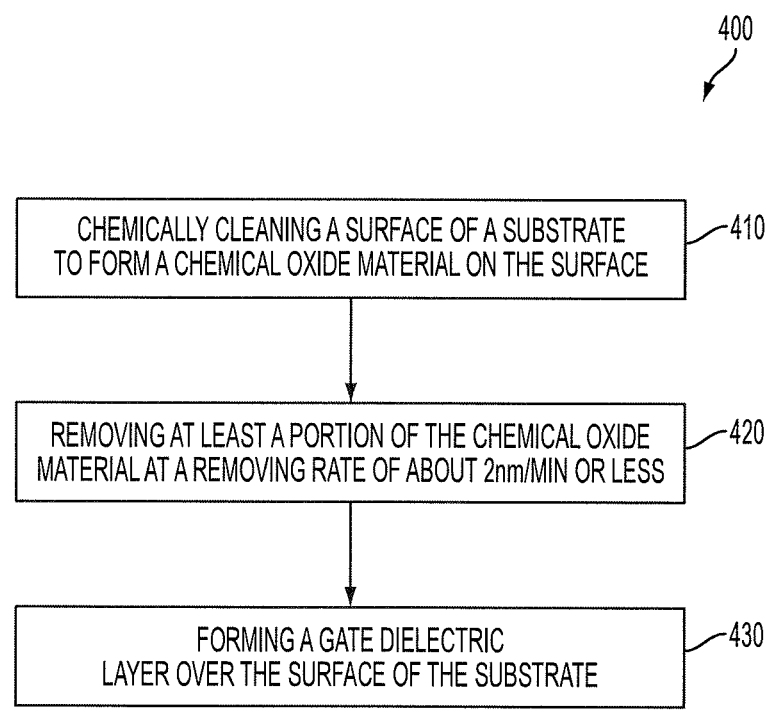
FIG. 4 is a flow chart illustrating an exemplary method of forming a semiconductor device.

FIG. 4 is a schematic drawing illustrating an exemplary method of forming a semiconductor device. In some embodiment, a method 400 of forming a semiconductor device can include block 410 in which chemically cleaning a surface of a substrate to form a chemical oxide material on the surface. The method 400 can continue with block 420 in which at least a portion of the chemical oxide material is removed at a removing rate of about 2 nanometer/minute (nm/min) or less. Thereafter, the method 400 can include forming a gate dielectric layer over the surface of the substrate 430.

In some embodiments, chemically cleaning a surface of a substrate in block 410 can be similar to cleaning a surface of the substrate in block 104 described above in conjunction with FIG. 1. As noted, the surface clean 250 (shown in FIG. 2A) can include at least one of a standard RCA cleaning process, a SPM cleaning process, an SC1 cleaning process, and a SC2 cleaning process. The surface clean 250 can form a chemical oxide material on the surface of the substrate 201. The chemical oxide material is formed substantially by a chemical reaction of the chemicals of the surface clean 250 and the surface of the substrate 201.

In some embodiments, removing at least a portion of the chemical oxide material in block 420 can be carried out by fluorine passivation process 260 described above in conjunction with FIG. 2B. In some embodiments, the removing process can have a removing rate of about 2 nm/min or less. In other embodiments, the removing rate can be about 1 nm/min or less. It is noted that the slow removing rate can desirably remove the chemical oxide material and/or avoid substantially damage the surface of the substrate 201.

In some embodiments, removing at least a portion of the chemical oxide material can include rotating the substrate 201. In some embodiments, rotating the substrate 201 can have a rotational speed of about 100 rounds per minute (RPM) or less. In some other embodiments, the rotational speed can range from about 100 RPM to about 10 RPM.

While rotating the substrate 201, removing at least a portion of the chemical oxide can include providing a hydrogen-fluoride-containing (HF-containing) gas to remove at least a portion of the chemical oxide material. In some embodiments, the HF-containing gas can be similar to the passivation mixture described above in conjunction with FIG. 2B.

In some embodiments, providing the HF-containing gas can include providing a carrier gas to a tank containing an HF-containing acid so as to carry an HF-containing vapor from the tank. For example, a carrier gas, e.g., $N_2$ and/or Ar, can be injected into the HF vapor generator 306 described above in conjunction with FIG. 3. The HF vapor generator 306 can be configured to store the HF-containing acid. The carrier gas can carry the saturated vapor of the HF-containing acid from the HF vapor generator 306.

In some embodiments, another carrier gas can be provided to another tank containing a solvent so as to carry a solvent vapor from the tank. For example, a carrier gas, e.g., $N_2$ and/or Ar, can be injected into the alcohol vapor generator 308 described above in conjunction with FIG. 3. The alcohol vapor generator 308 can be configured to store a solvent, e.g., IPA solvent. The carrier gas can carry the saturated vapor of the IPA solvent from the alcohol vapor generator 308. The IPA vapor is provided to the mixture 310 for diluting the HF-containing vapor. In some embodiments, the method 400 can include diluting the HF-containing vapor by increasing a flowing rate of at least one the carrier gases provided to the HF vapor generator 306 and the alcohol vapor generator 308.

Referring again to FIG. 4, the method 400 can include forming a gate dielectric layer over the surface of the substrate in block 430. In some embodiments, forming the gate dielectric layer can be similar to forming the gate dielectric layer of block 108 and/or forming the interfacial layer 107 described above in conjunction with FIG. 1.

Figure 5:
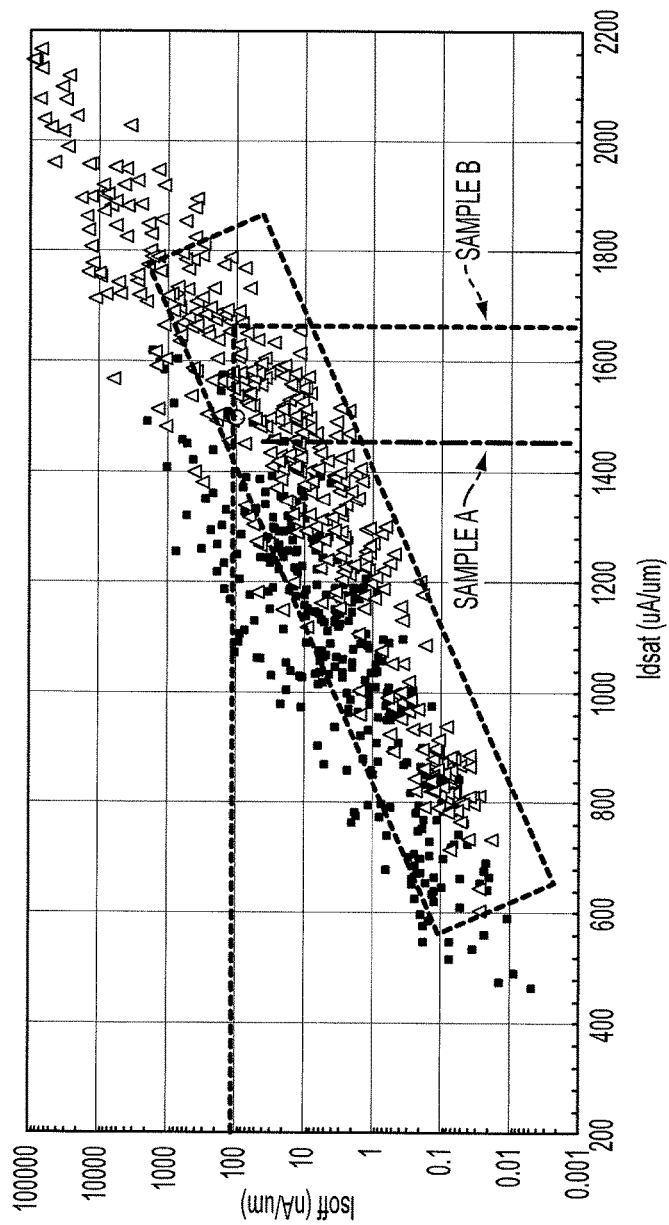
FIG. 5 is a chart illustrating leakage currents and on-currents of transistor samples by a conventional method and an exemplary method of the current application.

FIG. 5 is a chart illustrating leakage currents and on-currents of transistor samples by a conventional method and an exemplary method of the current application. In FIG. 5, sample A is prepared by a RCA process before the formation of the gate dielectric layer. Sample B is prepared by the method 400 described above in conjunction with FIG. 4. As shown, having the same leakage current level, Sample B has an on-current that is substantially larger than that of Sample A. In other words, Sample B has a leakage current and an interface defect density that are lower than those of Sample A.

Figure 6:
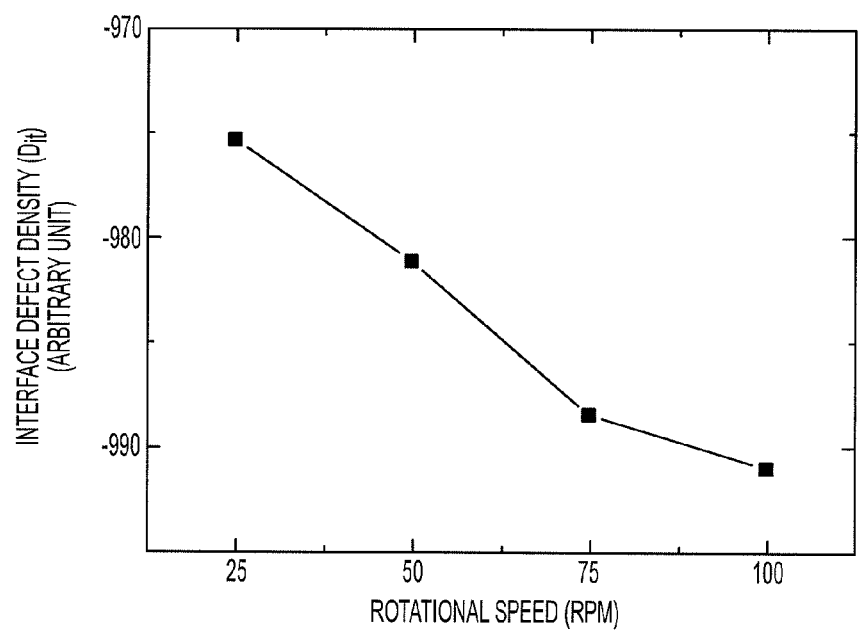
FIG. 6 is a chart illustrating a relationship between interface defect densities and rotational speeds.

FIG. 6 is a chart illustrating a relationship between interface defect densities and rotational speeds. In FIG. 6, the horizontal axis represents the rotational speed and the vertical axis represents the charges of the interfacial defect density ($D_{it}$). As shown in FIG. 6, if the rotational speed is slowed down from about 100 RPM to about 10 RPM, the interface defect density is decreased.

Figure 7:
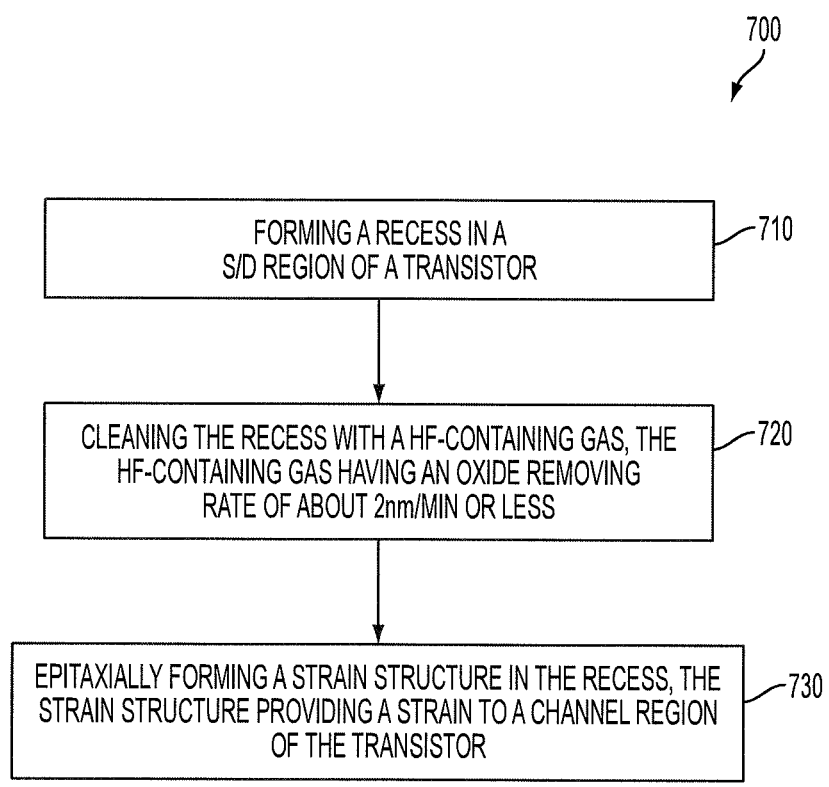
FIG. 7 is a flowchart showing an example method for fabricating a semiconductor device.
Figure 8A:
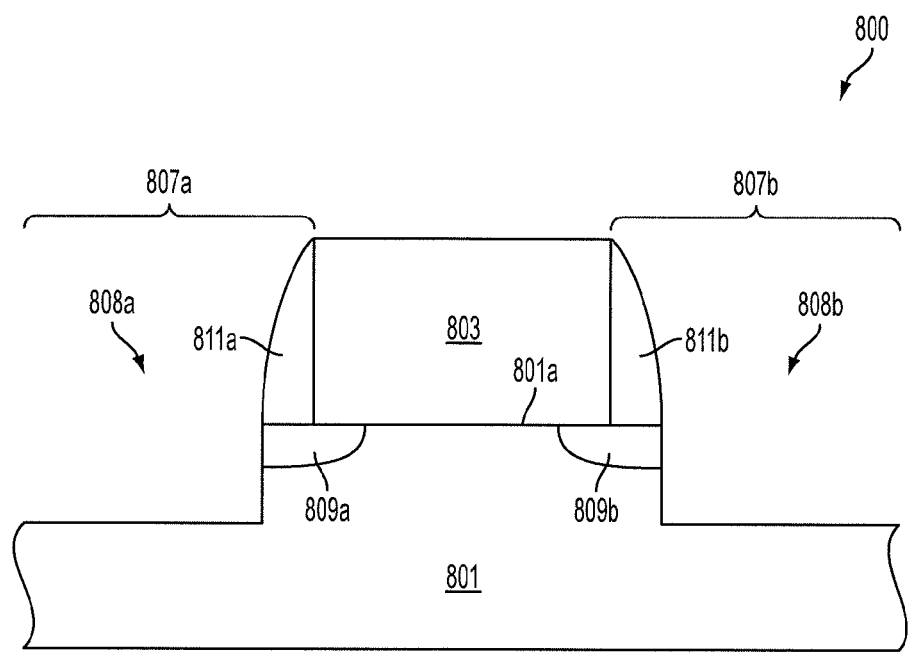
FIGS. 8A-8C are diagrammatic fragmentary cross-sectional views of a semiconductor device during various fabrication stages according to the method of FIG. 7.
Figure 8B:
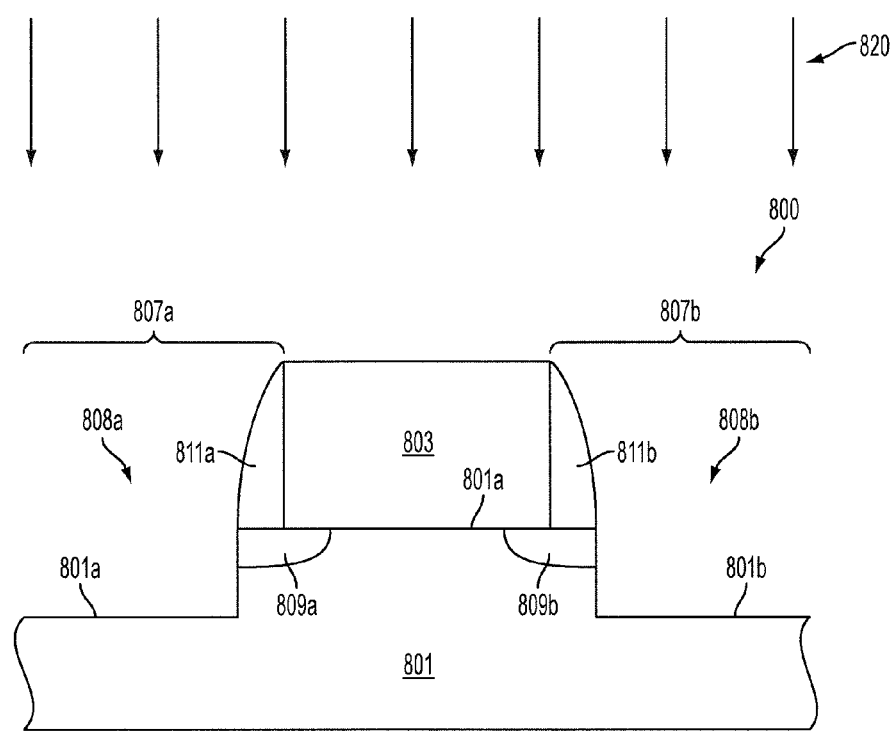
Figure 8C:
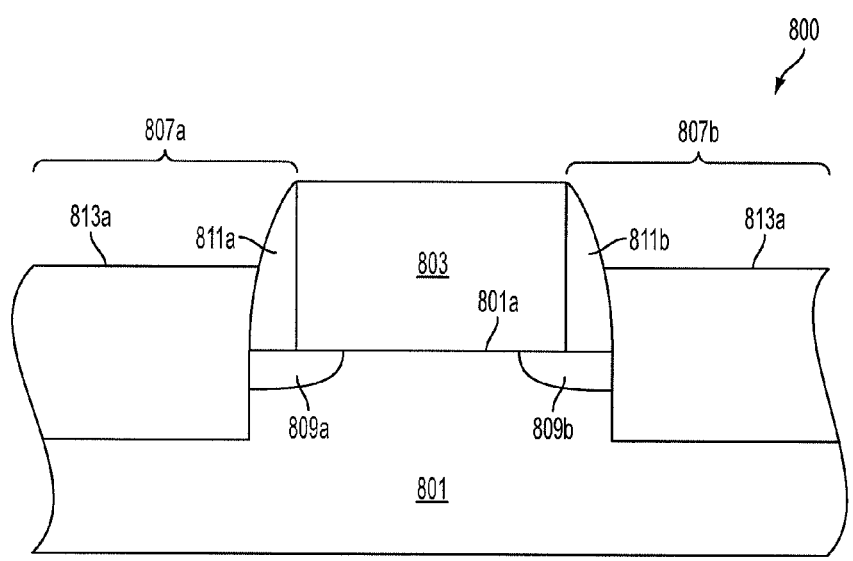

FIG. 7 is a flowchart showing an example method 700 for fabricating a semiconductor device. FIGS. 8A-8C are diagrammatic fragmentary cross-sectional views of the semiconductor device during various fabrication stages. In FIG. 7, a method 700 of forming a semiconductor device can include forming a recess in a source/drain (S/D) region of a transistor in block 710. The method 700 can include block 720 in which the recess is cleaned with a HF-containing gas, the HF-containing gas having an oxide removing rate of about 2 nm/min or less. After the cleaning process, the method 700 can include block 730 in which a strain structure is epitaxially formed in the recess for providing a strain to a channel region of the transistor.

Referring to FIGS. 7 and 8A, a recess can be formed in a source/drain (S/D) region of a transistor in block 710. For example, recesses 808a and 808b can be formed in S/D regions 807a and 807b, respectively, of a transistor 800. The recesses 808a and 808b can be formed by, for example, a dry etch process. In some embodiments, the transistor 800 can include a gate structure 803 formed over a substrate 801. The substrate 801 can be similar to the substrate 201 described above in conjunction with FIG. 2A.

In some embodiments, the gate structure 803 can be a conductive gate structure, e.g., a polysilicon gate structure, a metal gate structure, a dummy gate structure, or any suitable gate structure. For example, a conductive gate structure can have a stack structure including a gate dielectric layer, a conductive material layer, and/or other suitable layers. A metal gate structure can have a stack structure including a high dielectric constant gate layer, a diffusion barrier layer, a metal work function layer, a metallic layer, and/or other suitable layers. A dummy gate structure can have a stack structure including a dummy material layer, a hard mask layer, and/or other suitable layers.

In some embodiments, lightly-doped drains (LDDs) 809a and 809b can be formed in the substrate 801. Portions of the LDDs 809a and 809b can be formed under the gate structure 803. The LDDs 809a and 809b can be formed of n-type or p-type dopants (impurities). In some embodiments, at least one thermal annealing process, e.g., a rapid thermal annealing (RTA) process, can be performed to activate the dopants of the LDDs 809a and 809b. In some embodiments, the RTA process can have a spike annealing temperature of about 950° C.

In some embodiments, spacers 811a and 811b can be formed on the sidewalls of the gate structure 803. The spacers 811a and 811b can be made of at least one material, such as silicon oxide, silicon nitride, silicon oxynitride, other dielectric materials, and/or any combinations thereof. In some embodiments, the S/D regions 807a and 807b can be formed adjacent to sidewalls of the spacers 811a and 811b, respectively.

Referring to FIGS. 7 and 8B, the recess is cleaned with a HF-containing gas. For example, a cleaning process 820 can clean the recesses 808a and 808b with a HF-containing gas. The HF-containing gas can have an oxide removing rate of about 2 nm/min or less. In some embodiments, the cleaning process 820 can be similar to the fluorine passivation process 260 described above in conjunction with FIG. 2B and/or the removing process 420 described above in conjunction with FIG. 4. As shown in FIG. 8B, the cleaning process 820 can clean the surfaces 801a and 801b of the substrate 801. As noted, the cleaning process 820 can have a slow oxide removing rate of about 2 nm/min or less. The cleaning process 820 can desirably remove a native oxide and/or a chemical oxide on the surfaces 801a and 801b without substantially damaging the surfaces 801a and 801b. In other embodiments, the oxide removing rate can be about 1 nm/min or less.

Referring to FIGS. 7 and 8C, after the cleaning process, a strain structure is epitaxially formed in the recess for providing a strain to a channel region of the transistor in block 730. For example, strain structures 813a and 813b can be epitaxially formed in the recesses 808a and 808b, respectively, for providing a strain to a channel region of the transistor 800. In some embodiments forming a P-type transistor, the strain structures 813a and 813b can be made of a material, such as silicon-germanium (SiGe), for providing a compressive strain to the channel under gate structure 803. In other embodiments forming an N-type transistor, the strain structures 813a and 813 can be made of a material, such as silicon-carbide (SiC), for providing a tensile strain to the channel under gate structure 803. In some embodiments, the strain structures 813a and 813b can be formed by chemical vapor deposition (CVD), e.g., low pressure CVD (LPCVD), atomic layer CVD (ALCVD), ultrahigh vacuum CVD (UHVCVD), reduced pressure CVD (RPCVD), any suitable CVD; molecular beam epitaxy (MBE) process; any suitable epitaxial process; or any combinations thereof.

In some embodiments, the cleaning process 820 described above in conjunction with FIG. 8B can be applied on various semiconductor structures, e.g., FINFET transistors, micro electro-mechanical systems (MEMSs), STI structures, and/or other semiconductor structures. Due to its vapor nature, the cleaning process 820 does not substantially damage and/or crash micro structures of the FINFET transistors and MEMSs. In some embodiments cleaning STI structures, the cleaning process 820 can be used between performing an oxide CMP and a process of removing a pad nitride material. For example, after the fill-in of STI oxide, the STI oxide is subject to the oxide CMP for planarizing and exposing the pad nitride material. The cleaning process 820 is then used to remove a portion of the planarized STI oxide to a level, such that the STI oxide is substantially leveled with a liner oxide between the pad nitride material and the substrate. The pad nitride material is then removed and a substantially planarized STI structure can be achieved.

In a first exemplary embodiment, a method of forming a semiconductor device includes chemically cleaning a surface of a substrate to form a chemical oxide material on the surface. At least a portion of the chemical oxide material is removed at a removing rate of about 2 nanometer/minute (nm/min) or less. Thereafter, a gate dielectric layer is formed over the surface of the substrate.

In a second exemplary embodiment, a method of cleaning a semiconductor structure includes providing a semiconductor structure. The semiconductor structure is rotated. The semiconductor structure is cleaned with a hydrogen fluoride (HF)-containing gas.

In a third exemplary embodiment, a method of forming a semiconductor device includes forming a recess in a source/drain (S/D) region of a transistor. The recess is cleaned with a HF-containing gas. The HF-containing gas has an oxide removing rate of about 2 nanometer/minute (nm/min) or less. Thereafter, a strain structure is epitaxially formed in the recess. The strain structure provides a strain to a channel region of the transistor.

One aspect of this description relates to a method of cleaning a semiconductor structure. The method includes rotating a semiconductor structure. The method further includes cleaning the semiconductor structure with a hydrogen fluoride (HF)-containing gas.

Another aspect of this description relates to a method of forming a semiconductor device. The method includes forming a recess in a source/drain (S/D) region of a transistor. The method further includes cleaning the recess with a HF-containing gas, the HF-containing gas having an oxide removing rate of about 2 nanometer/minute (nm/min) or less. The method further includes epitaxially forming a strain structure in the recess after the cleaning the recess, the strain structure providing a strain to a channel region of the transistor.

Still another aspect of this description relates to a method of forming a semiconductor device. The method includes forming a recess in a substrate, wherein a dopant concentration in the substrate adjacent to a portion of a sidewall of the recess is different from a dopant concentration in the substrate adjacent to a bottom surface of the recess. The method further includes cleaning the sidewall and the bottom surface of the recess with a HF-containing gas, the HF-containing gas having an oxide removing rate of about 1 nanometer/minute (nm/min) or less. The method further includes forming a strained structure in the cleaned recess.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of forming a semiconductor structure, the method comprising:
   chemically cleaning a surface of a substrate, wherein cleaning the surface of the substrate forms a chemical oxide material on the surface;
   rotating a semiconductor structure;
   cleaning the semiconductor structure with a hydrogen fluoride (HF)-containing gas, wherein cleaning the semiconductor structure comprises:
      supplying a first carrier gas to a first tank containing an HF-containing acid so as to carry an HF-containing vapor from the first tank; and
      supplying a second carrier gas to a second tank containing a solvent so as to carry a solvent vapor gas from the second tank, wherein the first carrier gas and the second carrier gas are supplied from a same carrier gas supply;
   performing a fluorine passivation process on the cleaned semiconductor structure, wherein performing the fluorine passivation process comprises forming a fluorine containing layer having a fluorine concentration greater than 2 atomic percent; and
   depositing a dielectric layer on the fluorine containing layer.

2. The method of claim 1, wherein cleaning the semiconductor structure has a removing rate of the chemical oxide material of about 2 nanometer/minute (nm/min) or less.

3. The method of claim 1, wherein rotating the substrate has a rotational speed of about 100 rounds per minute (RPM) or less.

4. The method of claim 1, wherein cleaning the semiconductor structure further comprises:
   controlling a flow of the second carrier gas to dilute the HF-containing vapor.

5. The method of claim 4, further comprising:
   diluting the HF-containing vapor by controlling a flowing rate of the first carrier gas.

6. A method of forming a semiconductor device, the method comprising:
   forming a recess in a source/drain (S/D) region of a transistor; and
   cleaning the recess with a HF-containing gas, the HF-containing gas having an oxide removing rate of about 2 nanometer/minute (nm/min) or less; performing a fluorine passivation process on the cleaned semiconductor structure, wherein performing the fluorine passivation process comprises forming a fluorine containing layer having a fluorine concentration greater than 2 atomic percent; and epitaxially forming a strain structure in the recess after the cleaning the recess, the strain structure providing a strain to a channel region of the transistor.

7. The method of claim 6, wherein the removing rate is about 1 nm/min or less.

8. The method of claim 6, wherein cleaning the recess comprises:
rotating the substrate; and
providing the HF-containing gas to clean the recess.

9. The method of claim 8, wherein rotating the substrate has a rotational speed of about 100 rounds per minute (RPM) or less.

10. The method of claim 8, wherein providing the HF-containing gas comprises:
providing a first carrier gas to a first tank containing an HF-containing acid so as to carry an HF-containing vapor from the first tank.

11. The method of claim 10, further comprising:
providing a second carrier gas to a second tank containing a solvent so as to carry a solvent vapor gas from the second tank, wherein the solvent vapor is provided to dilute the HF-containing vapor.

12. The method of claim 11, further comprising:
diluting the HF-containing vapor by increasing a flowing rate of at least one of the first carrier gas or the second carrier gas.

13. A method of forming a semiconductor device, the method comprising:
forming a recess in a substrate, wherein a dopant concentration in the substrate adjacent to a portion of a sidewall of the recess is different from a dopant concentration in the substrate adjacent to a bottom surface of the recess; and
cleaning the sidewall and the bottom surface of the recess with a HF-containing gas, the HF-containing gas having an oxide removing rate of about 1 nanometer/minute (nm/min) or less, wherein cleaning the sidewall and the bottom surface of the recess with the HF-containing gas comprises controlling a concentration of the HF-containing gas based on an amount of carbon or oxygen on the sidewall and the bottom surface;

performing a fluorine passivation process on the cleaned semiconductor structure, wherein performing the fluorine passivation process comprises forming a fluorine containing layer having a fluorine concentration greater than 2 atomic percent; and forming a strained structure in the cleaned recess.

14. The method of claim 13, wherein cleaning the sidewall and the bottom surface of the recess comprises rotating the substrate.

15. The method of claim 13, wherein cleaning the sidewall and the bottom surface of the recess comprises providing a first carrier gas to a first tank containing an HF-containing acid so as to carry an HF-containing vapor from the first tank.

16. The method of claim 15, further comprising:
providing a second carrier gas to a second tank containing a solvent so as to carry a solvent vapor gas from the second tank, wherein the solvent vapor is provided to dilute the HF-containing vapor.

17. The method of claim 16, adjusting a concentration of the HF-containing vapor by adjusting a flowing rate of at least one of the first carrier gas or the second carrier gas.

18. The method of claim 13, wherein cleaning the sidewall and the bottom surface of the recess comprises at least one of a standard RCA cleaning process, a SPM cleaning process, a standard cleaning 1 (SC1) process, or a standard cleaning 2 (SC2) process.

19. The method of claim 13, wherein cleaning the sidewall and the bottom surface of the recess comprises diluting the HF-containing vapor with isopropyl alcohol (IPA).

20. The method of claim 19, wherein diluting the HF-containing vapor comprises diluting the HF-containing vapor to have a HF:IPA weight ratio ranging from 0.5:1 to 10:1.

* * * * *